(12) United States Patent
Madan

(10) Patent No.: US 7,244,995 B2
(45) Date of Patent: Jul. 17, 2007

(54) SCRAMBLING METHOD TO REDUCE WORDLINE COUPLING NOISE

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 354 days.

(21) Appl. No.: 10/968,798

(22) Filed: Oct. 18, 2004

(65) Prior Publication Data

US 2006/0081944 A1    Apr. 20, 2006

(51) Int. Cl.
*H01L 29/76*  (2006.01)
*H01L 29/94*  (2006.01)
*H01L 31/062* (2006.01)
*H01L 31/113* (2006.01)
*H01L 31/119* (2006.01)

(52) U.S. Cl. .............. 257/380; 257/390; 257/E27.108

(58) Field of Classification Search ............... 257/380, 257/390, 907, E27.108
See application file for complete search history.

(56) References Cited

U.S. PATENT DOCUMENTS

| 5,602,772 | A  | * | 2/1997 | Nakano et al. ............... 365/51 |
| 5,732,010 | A  | * | 3/1998 | Takashima et al. ........... 365/63 |
| 6,873,537 | B2 |   | 3/2005 | Kang |
| 2003/0072172 | A1 | * | 4/2003 | Somasekhar et al. ......... 365/63 |
| 2004/0062069 | A1 | * | 4/2004 | Keeth .......................... 365/63 |

* cited by examiner

*Primary Examiner*—Ngân V. Ngô
(74) *Attorney, Agent, or Firm*—Jacqueline J. Garner; W. James Brady, III; Frederick J. Telecky, Jr.

(57) ABSTRACT

A memory circuit and method to reduce array noise due to wordline coupling is disclosed. The circuit includes a plurality of memory cells arranged in rows (702, 704, and 706) and columns (750, 752). Each row has a first part (1102) and a second part (1108). A first conductor (750) is coupled to a respective column of memory cells in each first part. A second conductor (752) is coupled to a respective column in each second part. A third conductor is coupled to a control terminal of each memory cell in the first part (1102) of a first row and the second part (1108) of a second row.

23 Claims, 12 Drawing Sheets

FIG. 1
*(PRIOR ART)*
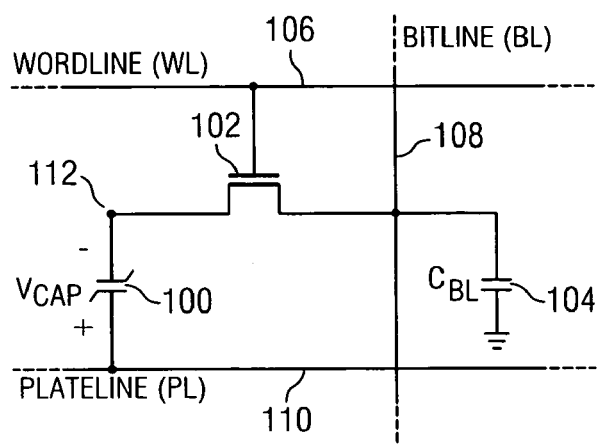
FIG. 2
*(PRIOR ART)*
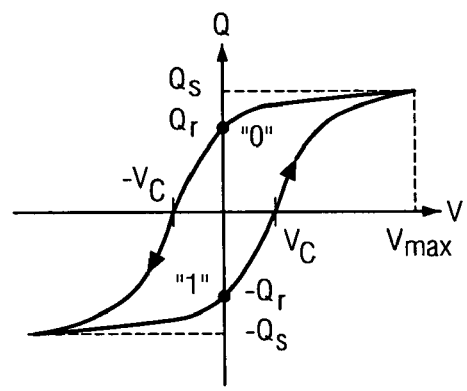
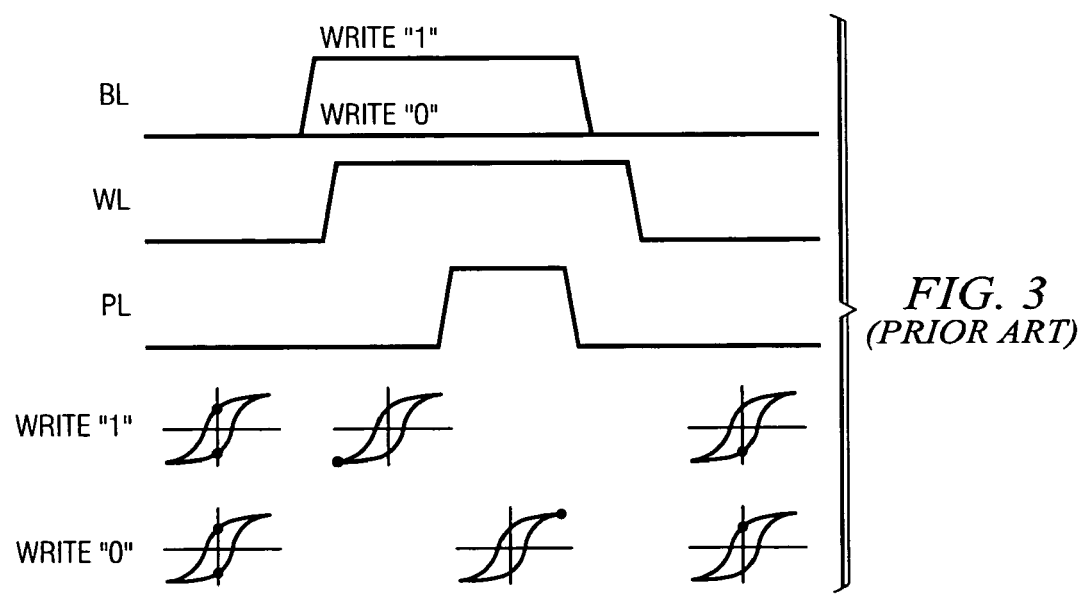
FIG. 3
*(PRIOR ART)*

SCRAMBLING METHOD TO REDUCE WORDLINE COUPLING NOISE

FIELD OF THE INVENTION

This invention generally relates to electronic circuits, and more specifically to noise reduction in semiconductor integrated circuits.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. However, both ferroelectric materials suffer from fatigue and imprint. Fatigue is characterized by a gradual decrease in net stored charge with repeated cycling of a ferroelectric capacitor. Imprint is a tendency to prefer one state over another if the ferroelectric capacitor remains in that state for a long time.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor (FeCAP) 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Parasitic capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and voltage along the horizontal axis. By convention, the polarity of cell voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying −Vmax to the ferroelectric capacitor. This charges the linear and switching components of the ferroelectric capacitor to a saturation charge of −Qs. The stored charge reverts to −Qr when the electric field is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to −Qs. When plateline PL goes high, the voltage across the ferroelectric capacitor is 0 V, and the stored charge reverts to −Qr. At the end of the write cycle, both bitline BL and plateline PL go low and stored charge −Qr remains on the ferroelectric capacitor. Alternatively, the write "0" occurs when bitline BL remains low and plateline PL goes high. This places a positive voltage across the ferroelectric capacitor and charges it to Qs representing a stored "1". When plateline PL goes low, the voltage across the ferroelectric capacitor is 0 V, and the stored charge reverts to Qr representing a stored "0".

A step sensing read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $t_0$ precharge signal PRE goes low, permitting the bitlines BL to float. At times $t_1$ and $t_2$ wordline WL and plateline PL go high, respectively, thereby permitting each memory cell connected to the active wordline WL and plateline PL to share charge with a respective bitline. A stored "1" will share more charge with parasitic bitline capacitance $C_{BL}$ and produce a greater bitline voltage than the stored "0" as shown between times $t_2$ and $t_3$. A reference voltage (not shown) is produced at each complementary bitline of an accessed bitline. This reference voltage is between the "1" and "0" voltages at time $t_3$. A difference voltage between either a "1" or "0" voltage and a corresponding reference voltage is applied to each respective sense amplifier. The sense amplifiers are activated at time $t_3$ to amplify the difference voltage. When respective bitline voltages are fully amplified after time $t_3$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plateline PL goes low and applies $-V_{max}$ to the read "1" cell, thereby storing $-Q_s$. At the same time, zero voltage is applied to the read "0" cell and charge $Q_r$ is restored. At the end of the read cycle, signal PRE goes high and precharges both bitlines BL return to zero volts or ground. The wordline goes low, thereby isolating the ferroelectric capacitor from the bitline. Thus, zero volts is applied to the read "1" cell and $-Q_r$ is restored.

Referring now to FIG. 5, a pulse sensing read operation is illustrated for a ferroelectric memory circuit. The read operation begins at time $t_0$ when precharge signal PRE goes low, permitting the bitlines BL to float. Wordline WL and plateline PL are initially low, and bitlines BL are precharged low. At time $t_1$, wordline WL goes high, thereby coupling a ferroelectric capacitor to a respective bitline. Then plateline PL goes high at time $t_2$, thereby permitting each memory cell to share charge with the respective bitline. The ferroelectric memory cells share charge with their respective bitlines BL and develop respective difference voltages. Here, $V_1$ represents a data "1" and $V_0$ represents a data "0". Plateline PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bitline BL voltages are developed while the plateline PL is low. Thus, the data "1" cell is fully restored while plateline PL is low and the data "1" bitline BL is high. Subsequently, the plateline PL goes high while the data "0" bitline BL remains low. Thus, the data "0" cell is restored. The plateline PL goes low at time $t_4$, and precharge signal PRE goes high at time $t_5$. The high level of precharge signal PRE precharges the bitlines to ground or Vss. The wordline WL goes low at time $t_6$, thereby isolating the ferroelectric capacitor from the bitline and completing the pulse sensing cycle.

Referring to FIG. 7, there is a schematic diagram of a ferroelectric memory circuit. Although the memory circuit includes many similar memory arrays, only a portion of the array is shown for clarity. The memory array includes memory cells arranged in rows corresponding to wordlines 702, 704, 706 and columns 750, 752. Individual memory cells are indicated by circles at intersections of rows and columns. The memory circuit includes 16 platelines 710–718. Each plateline is coupled to receive a respective plateline signal $PL_0$–$PL_{15}$. Each plateline, for example plateline 710, is common to 32 rows of memory cells including rows common to wordlines 702–706. Each row of memory cells is selected by an active wordline signal. For example, row 704 is selected by active wordline signal $WL_X$ on wordline 704. Each column includes a bitline 708 and a complementary bitline 709 that form a bitline pair. Each bitline pair is coupled to a respective sense amplifier such as sense amplifier 730. Each sense amplifier has complementary output terminals coupled to local input/output lines LIO 746 and /LIO 748 by column select transistors 742 and 744, respectively. The column select transistors are selected by an active column select signal, for example, $YS_Y$ on lead 740. Each column has a respective precharge circuit including first 724, second 726, and third 728 precharge transistors. The first and second precharge transistors respectively couple the bitline 708 and complementary bitline 709 to voltage terminal GND via lead 722 in response to an active precharge signal PRE on lead 720. A third precharge transistor couples the bitline 708 and complementary bitline 709 to each other in response to the active precharge signal PRE on lead 720.

In operation, the control and decode circuit 700 receives a chip enable signal CE, an address signal $A_N$ including N address bits, and a read/write signal WR. The control and decode circuit produces an active wordline signal WL, an active column select signal YS, an active plateline signal PL, and a precharge signal PRE, where WL, YS, and PL represent a respective group of wordlines, column select lines, and platelines. A selected memory cell at the intersection of the addressed row and column receives or produces data on a respective bitline in response to a logical state of read/write signal WR. For example, when signal WR is high, a write operation is performed. Alternatively, when signal WR is low, a read operation is performed. For either a read or a write operation, when a wordline signal such as wordline signal $WL_X$ goes active high, a small voltage is coupled to adjacent wordlines $WL_{X+1}$ 702 and $WL_{X-1}$ 706 through fringe capacitors CF 770 and 772, respectively, and other sources. These other sources include plateline coupling. However, capacitive coupling from sources other than an adjacent wordline is omitted for simplicity. The wordline capacitive coupling increases the voltage on the adjacent wordlines $WL_{X+1}$ 702 and $WL_{X-1}$ 706 by as much as 100 mV and increases subthreshold leakage by approximately one order of magnitude. Next, a low-to-high transition of plateline signal $PL_0$ 710 induces subthreshold current to flow from the storage node to the bitline. This charge loss couples as much as $-1.3$ mV to the storage node of each memory cell along adjacent wordlines 702 and 706 following a subsequent high-to-low transition of plateline signal $PL_0$ 710. Moreover, the subthreshold current from bitline to storage node of the memory cells on adjacent wordlines 702 and 706 when plateline signal $PL_0$ is low is much less than when high, because the drain-to-source voltage of each access transistor is much less. Thus, repeated access to wordline $WL_X$ 704 results in accumulated negative voltage of as much as $-100$ mV at the storage node of each memory cell on adjacent wordlines 702 and 706.

Turning now to FIG. 6, there is a simplified diagram of an unselected ferroelectric memory cell such as on adjacent wordlines $WL_{X+1}$ 702 and $WL_{X-1}$ 706 (FIG. 7) illustrating a problem with both step and pulse sensing schemes. Here, the same reference numerals are used as in the memory cell of FIG. 1 to show comparable elements of the ferroelectric memory cell. Resistor $R_{GATE}$ 114 represents subthreshold leakage path of access transistor 102. Diode 116 is a parasitic junction diode between storage node 112 and the memory circuit substrate. The wordline terminal WL 106 is adjacent a selected wordline (not shown). Each wordline is typically formed of a polycrystalline silicon layer in parallel with a metal shunt. This metal shunt is much less resistive than the polycrystalline silicon wordline and is connected at regular intervals to decrease wordline resistance. During a read operation the wordline terminal 106 may develop up to 100 mV during a low-to-high transition of the adjacent active wordline, as will be explained in detail. Plateline 110 is common to cells on the selected wordline as well as the unselected cell. Ferroelectric capacitor 100 stores a respective data signal and preferably has zero volts until a coercive voltage is developed across the terminals as previously explained. For the following exemplary discussion, ferroelectric capacitor 100 has approximately 30 fF capacitance.

During a read or write operation a selected wordline adjacent wordline WL 106 is driven high to approximately 2.2 V. This adjacent wordline capacitively couples 100 mV to wordline terminal 106 and greatly increases subthreshold conduction of access transistor 102. Bitline BL 108 is driven low, and plateline PL 110 is driven high to approximately 1.65 V. Due to charge sharing with diode 116 and gate-to-source capacitance of access transistor 102, the plateline PL transition couples 1.6 V to storage node 112. Thus, storage node 112 goes from 0 V to 1.6 V. Under these conditions at high temperature, subthreshold leakage current $I_{SUB}$ of access transistor 102 increases from less than 1 nA when there is no coupling to wordline 106 to approximately 10 nA, or about one order of magnitude, when 100 mV is coupled to wordline 106. This level of subthreshold leakage current through resistor $R_{GATE}$ 114 lasts for approximately 4 ns until the polycrystalline silicon wordline is able to discharge through the metal shunt at the ends of a segment and the row decode circuit can restore wordline WL 106 to 0 V. The subthreshold current $I_{SUB}$ of 10 nA for 4 ns, however, represents a 1.3 mV decrease in storage node voltage subject to the previously described conditions. Moreover, this charge loss is cumulative. Minimal current flows from bitline BL 108 through access transistor 102 when plateline PL 110 returns to 0 V due to the small drain-to-source voltage. Subsequent memory accesses to memory cells adjacent wordline WL 106 and resulting charge loss, however, may result in a negative voltage of as much as −100 mV at storage node 112. Such memory accesses would significantly degrade the data "1" level of the ferroelectric memory cell resulting in read errors. This degradation of the data "1" level introduces a bitline voltage imbalance and may even depolarize the ferroelectric capacitor.

SUMMARY OF THE INVENTION

In accordance with a preferred embodiment of the invention, a memory circuit and method to reduce capacitive coupling to unselected wordlines is disclosed. The circuit includes a plurality of memory cells arranged in rows and columns. Each row has a first part and a second part. A first bitline is coupled to a respective column of memory cells in each first part. A second bitline is coupled to a respective column in each second part. A wordline is coupled to the first part of a first row and the second part of a second row. The wordline capacitance to each adjacent wordline is reduced, thereby reducing array noise and improving signal margin.

BRIEF DESCRIPTION OF THE DRAWINGS

The foregoing features of the present invention may be more fully understood from the following detailed description, read in conjunction with the accompanying drawings, wherein:

FIG. 1 is a circuit diagram of a ferroelectric memory cell of the prior art;

FIG. 2 is a hysteresis curve of the ferroelectric capacitor 100 of FIG. 1;

FIG. 3 is a timing diagram showing a write operation to the ferroelectric memory cell of FIG. 1;

FIG. 10 is a diagram showing an exemplary scrambling pattern for 32 wordlines of section 830 of FIG. 9;

FIG. 12 is a diagram showing another exemplary scrambling pattern for 32 wordlines of section 830 of FIG. 9;

FIG. 14 is a diagram showing an exemplary scrambling pattern for 32 wordlines with 3 redundant wordlines of section 830 of FIG. 9;

DETAILED DESCRIPTION OF PREFERRED EMBODIMENTS

Figure 16:
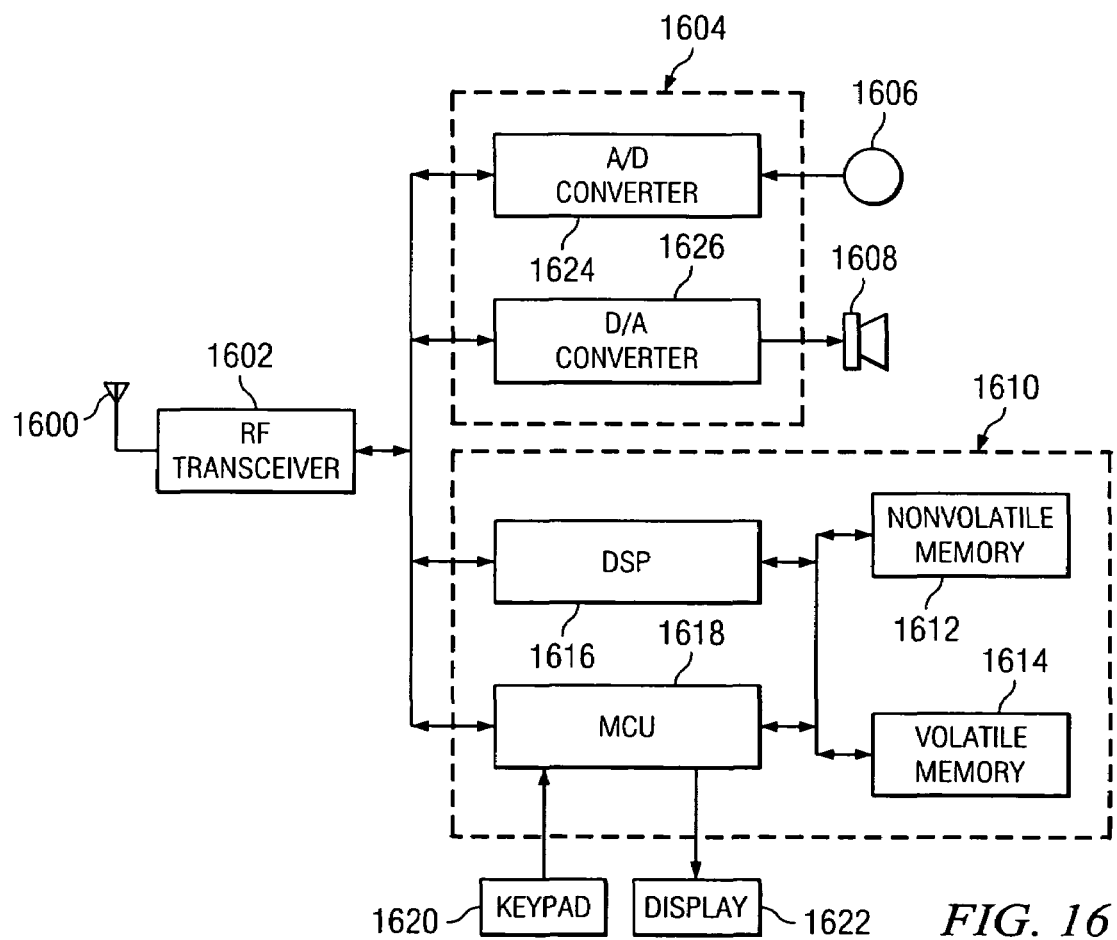
FIG. 16 is a block diagram of a wireless telephone as an example of a portable electronic device which could advantageously employ the present invention.

Referring to FIG. 16, there is a block diagram of a wireless telephone as an example of a portable electronic device which could advantageously employ this invention in memory arrays, decode circuits, interconnect cells, or any other geometrical array as is known in the art. The wireless telephone includes antenna 1600, radio frequency transceiver 1602, baseband circuits 1610, microphone 1606, speaker 1608, keypad 1620, and display 1622. The wireless telephone is preferably powered by a rechargeable battery (not shown) as is well known in the art. Antenna 1600 permits the wireless telephone to interact with the radio frequency environment for wireless telephony in a manner known in the art. Radio frequency transceiver 1602 both transmits and receives radio frequency signals via antenna 1600. The transmitted signals are modulated by the voice/data output signals received from baseband circuits 1610. The received signals are demodulated and supplied to baseband circuits 1610 as voice/data input signals. An analog section 1604 includes an analog to digital converter 1624 connected to microphone 1606 to receive analog voice signals. The analog to digital converter 1624 converts these analog voice signals to digital data and applies them to digital signal processor 1616. Analog section 1604 also includes a digital to analog converter 1626 connected to speaker 1608. Speaker 1608 provides the voice output to the user. Digital section 1610 is embodied in one or more integrated circuits and includes a microcontroller unit 1618, a digital signal processor 1616, nonvolatile memory circuit 1612, and volatile memory circuit 1614. Nonvolatile memory circuit 1612 may include read only memory (ROM), ferroelectric memory (FeRAM), FLASH memory, or other nonvolatile memory as known in the art. Volatile memory circuit 1614 may include dynamic random access memory (DRAM), static random access memory (SRAM), or other volatile memory circuits as known in the art. Microcontroller unit 1618 interacts with keypad 1620 to receive telephone number inputs and control inputs from the user. Microcontroller unit 1618 supplies the drive function to display 1622 to display numbers dialed, the current state of the telephone such as battery life remaining, and received alphanumeric messages. Digital signal processor 1616 provides real time signal processing for transmit encoding, receive decoding, error detection and correction, echo cancellation, voice band filtering, etc. Both microcontroller unit 1618 and digital signal processor 1616 interface with nonvolatile memory circuit 1612 for program instructions and user profile data. Microcontroller unit 1618 and digital signal processor 1616 also interface with volatile memory circuit 1614 for signal processing, voice recognition processing, and other applications.

Figure 8:
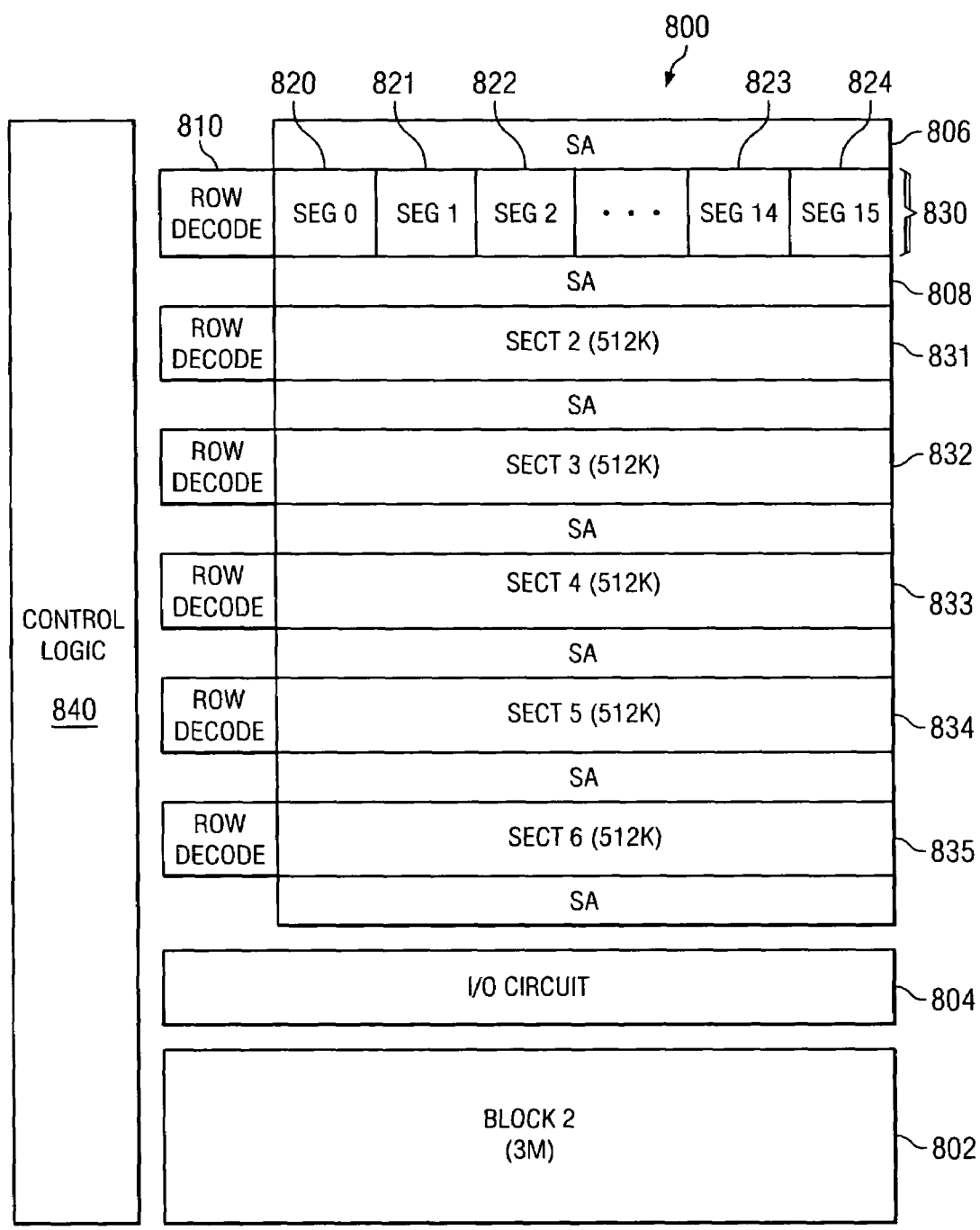
FIG. 8 is a block diagram of a 6 Megabit ferroelectric memory of the present invention.

Referring to FIG. 8, there is a block diagram of a 6 Megabit ferroelectric memory of the present invention. The memory is partitioned into upper 800 and lower 802 3 Megabit memory blocks. Both memory blocks are substantially identical except for decoding differences. Input and output logic circuits 804 are placed between the two 3 Megabit memory blocks. A control logic circuit 840 includes address, control, and timing circuits for operating the ferroelectric memory. Each memory block, for example memory block 800 is further partitioned into 6 substantially identical 512 K sections 830–835. Each section, for example section 830, is further partitioned into 16 segments 820–824. A row decode circuit 810 controls wordlines within section 830 in response to row address signals. Sense amplifier banks 806 and 808 amplify selected data signals from section 830.

Figure 9:
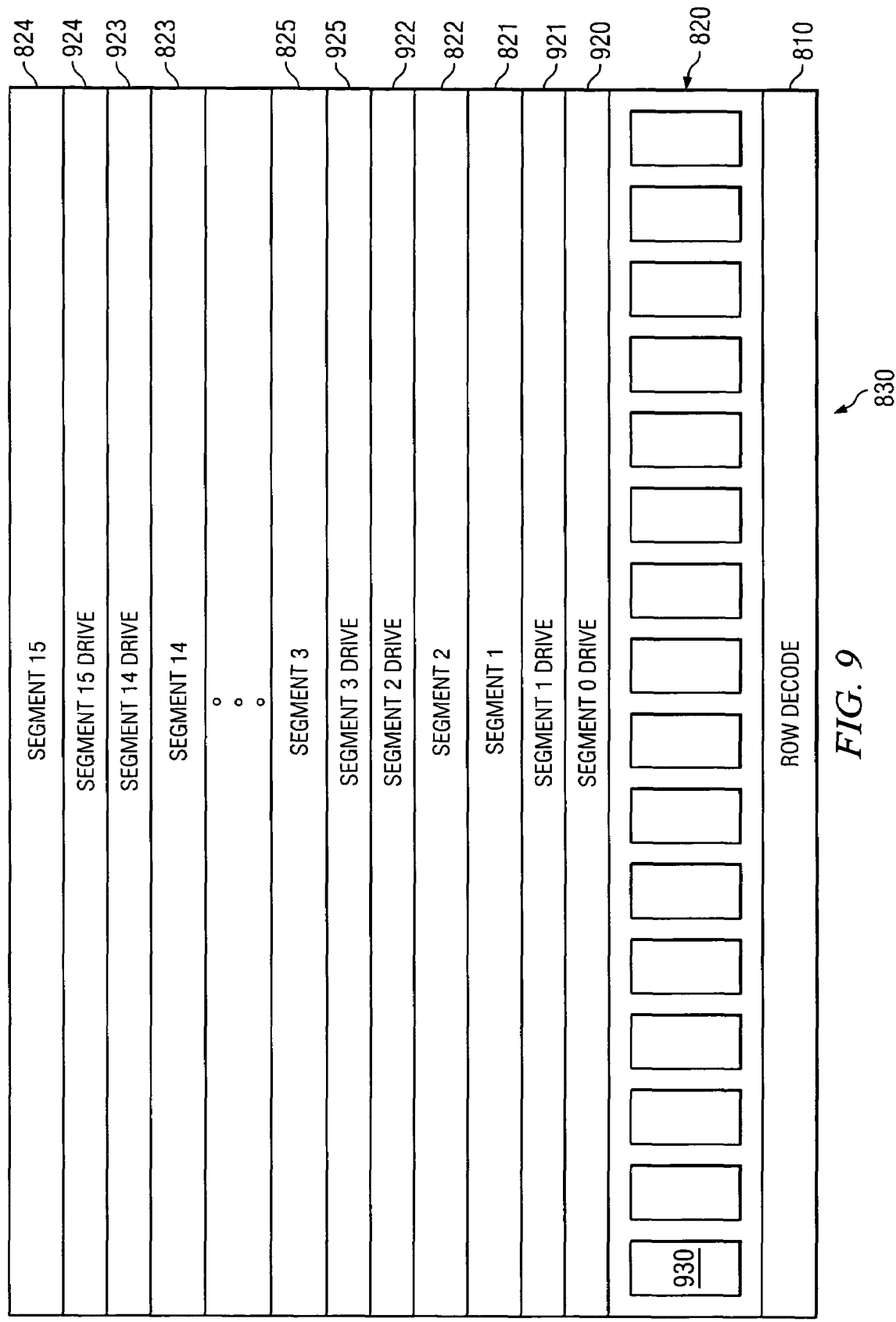
FIG. 9 is a block diagram of section 830 of the ferroelectric memory circuit of FIG. 8.

FIG. 9 is a block diagram of a 512 K section 830 of the ferroelectric memory circuit of FIG. 8. Section 830 is arranged in an array of 512 rows and 1024 columns of ferroelectric memory cells. Alternative embodiments of section 830 also include additional rows and columns of redundant memory (not shown) as is known in the art. Section 830 includes 16 plateline groups. Each plateline group corresponds to 32 rows of ferroelectric memory cells. Section 830 also includes 16 segments 820–825. Each segment includes a respective segment drive circuit 920–925. These segment drive circuits drive 16 respective platelines such as plateline 930 in segment 0 (820).

Figure 4:
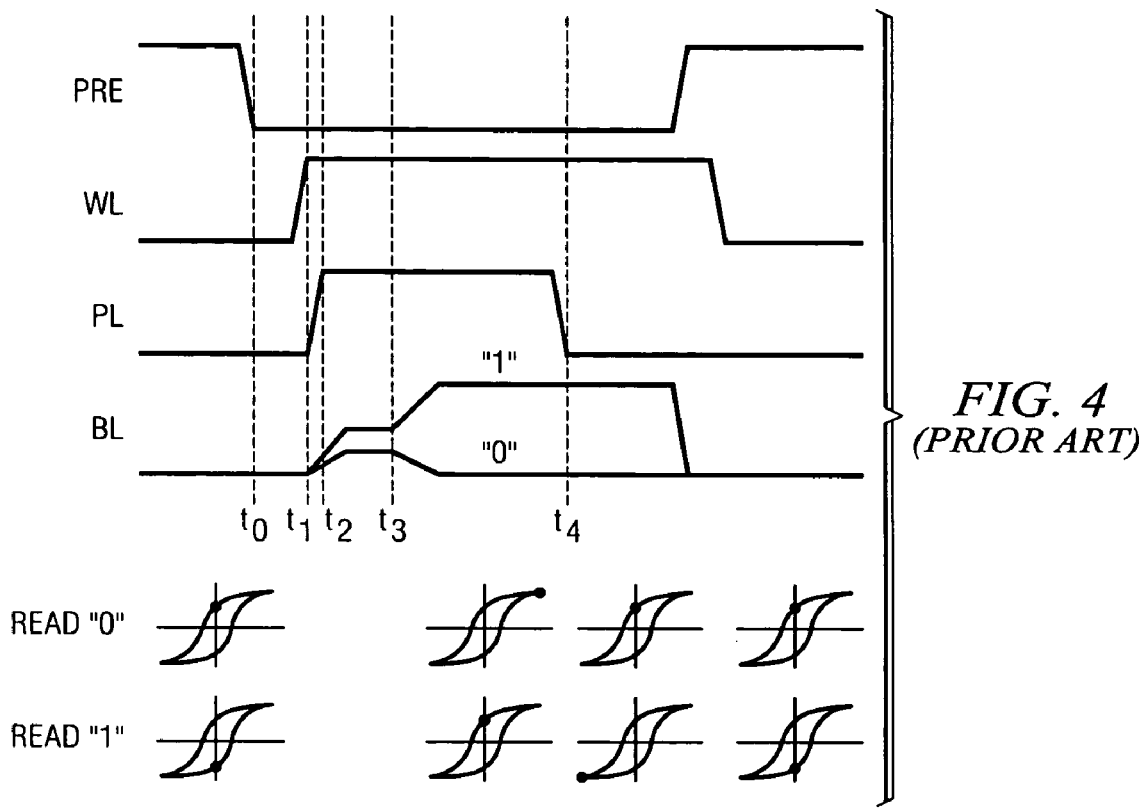
FIG. 4 is a timing diagram of a step sense read operation from the ferroelectric memory cell of FIG. 1.
Figure 5:
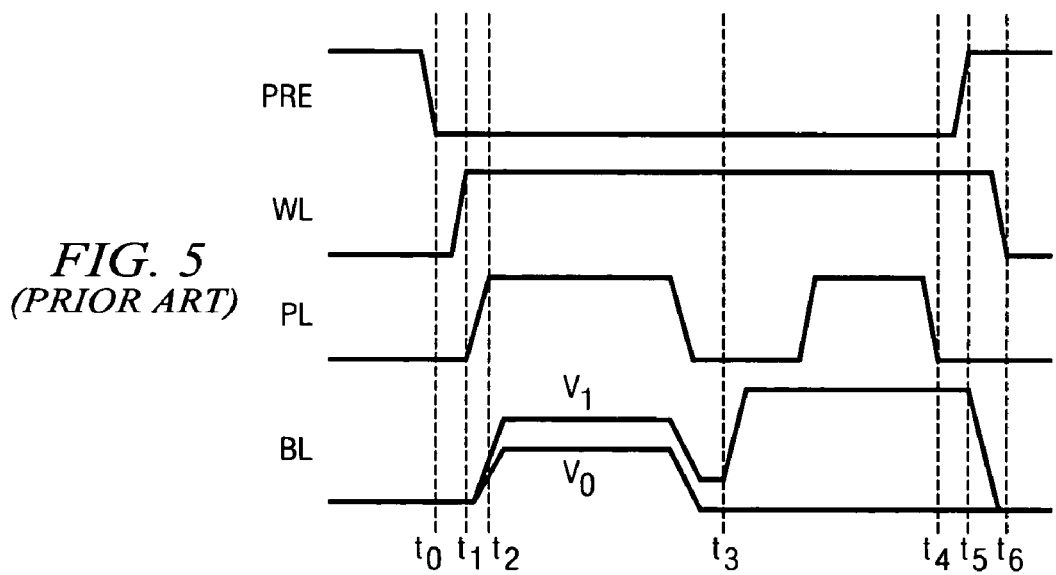
FIG. 5 is a timing diagram of a pulse sense read operation from the ferroelectric memory cell of FIG. 1.
Figure 6:
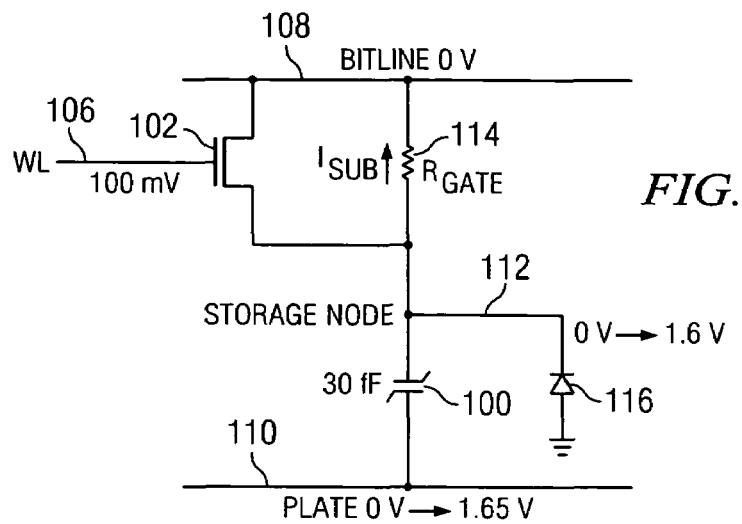
FIG. 6 is a simplified circuit diagram of the prior art showing charge accumulation at the ferroelectric memory cell storage node due to subthreshold leakage.
Figure 7:
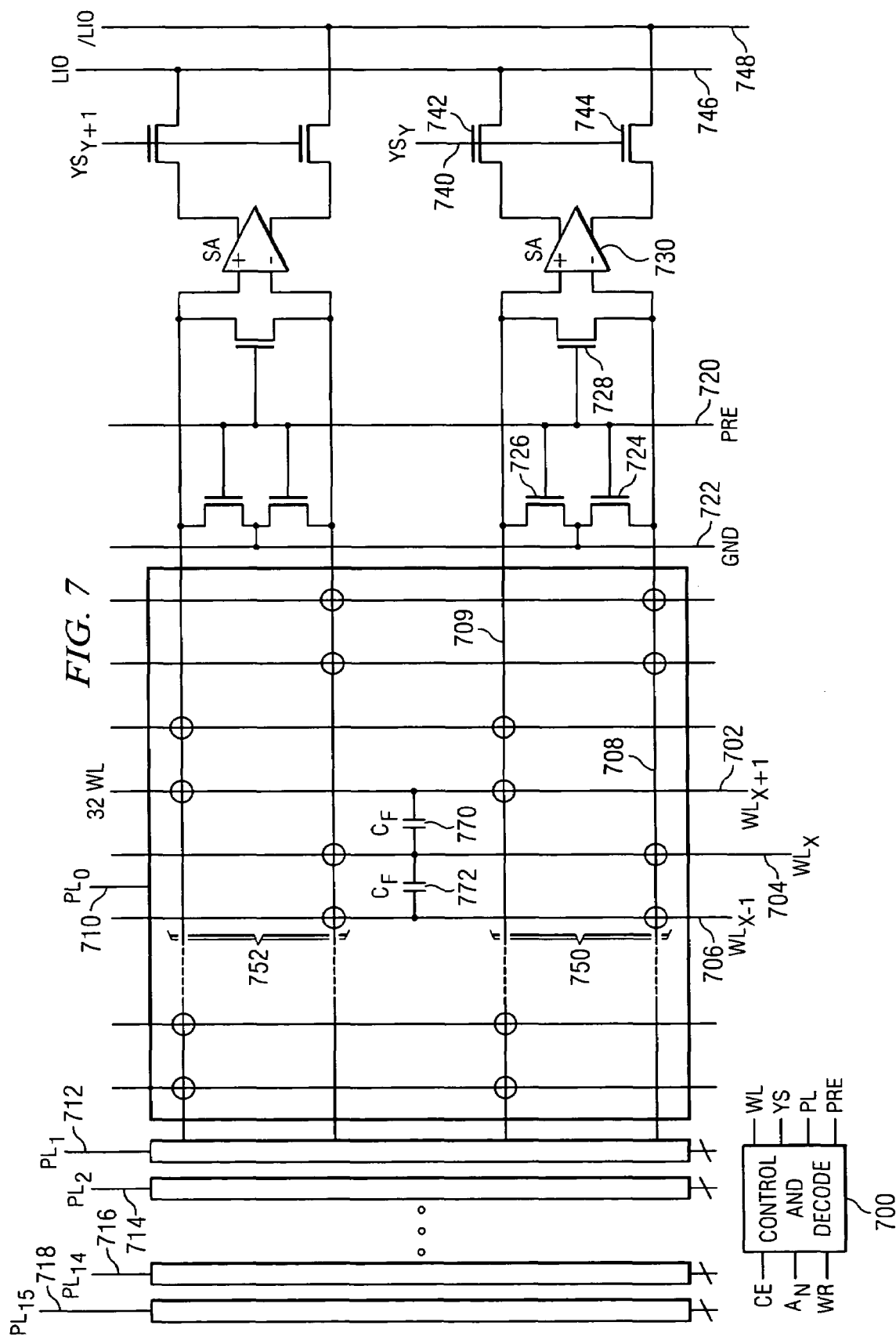
FIG. 7 is a schematic diagram of a of the memory circuit showing capacitive coupling to an unselected wordline.

In operation, a row of memory cells of section 830 is selected by 9 least significant row address bits RA0–RA8 applied to row decode circuit 810. The row decode circuit responsively selects a wordline common to all 16 segments in section 830. The wordline is preferably formed of a metal conductor overlying polycrystalline silicon segments corresponding to each segment 820–825. The polycrystalline silicon segments are control gates for respective memory cells such as control gate 106 (FIG. 6). Each polycrystalline silicon segment is preferably connected at each end to the metal conductor to minimize wordline resistance. The wordlines of each segment 820–825 are connected by the metal conductor. Each wordline includes area capacitance and fringe capacitance. Area capacitance includes capacitance of each access transistor 102 control gate, capacitance of the lower polycrystalline silicon surface to the underlying substrate, and capacitance of the upper surface of the metal conductor to overlying metal conductors. Fringe capacitance CF (FIG. 7) includes capacitance between the edges of the polycrystalline segments and metal conductor of wordline $WL_X$ 704 to the edges of polycrystalline segments and metal conductors of immediately adjacent wordlines $WL_{X-1}$ 706 and $WL_{X+1}$ 702 (FIG. 7). Although there are other components to fringe capacitance, their array noise contribution is negligible. According to a preferred embodiment of the present invention, the selected wordline advantageously couples very little voltage to adjacent unselected wordlines as will be explained in detail. A plateline is selected by 4 row address bits RA5–RA8 corresponding to the selected row and 4 column address bits CA6–CA9. Responsively, 64 ferroelectric memory cells produce data on respective bit-lines. These data are amplified by respective sense amplifiers of sense amplifier banks 806 and 808.

Figure 10:
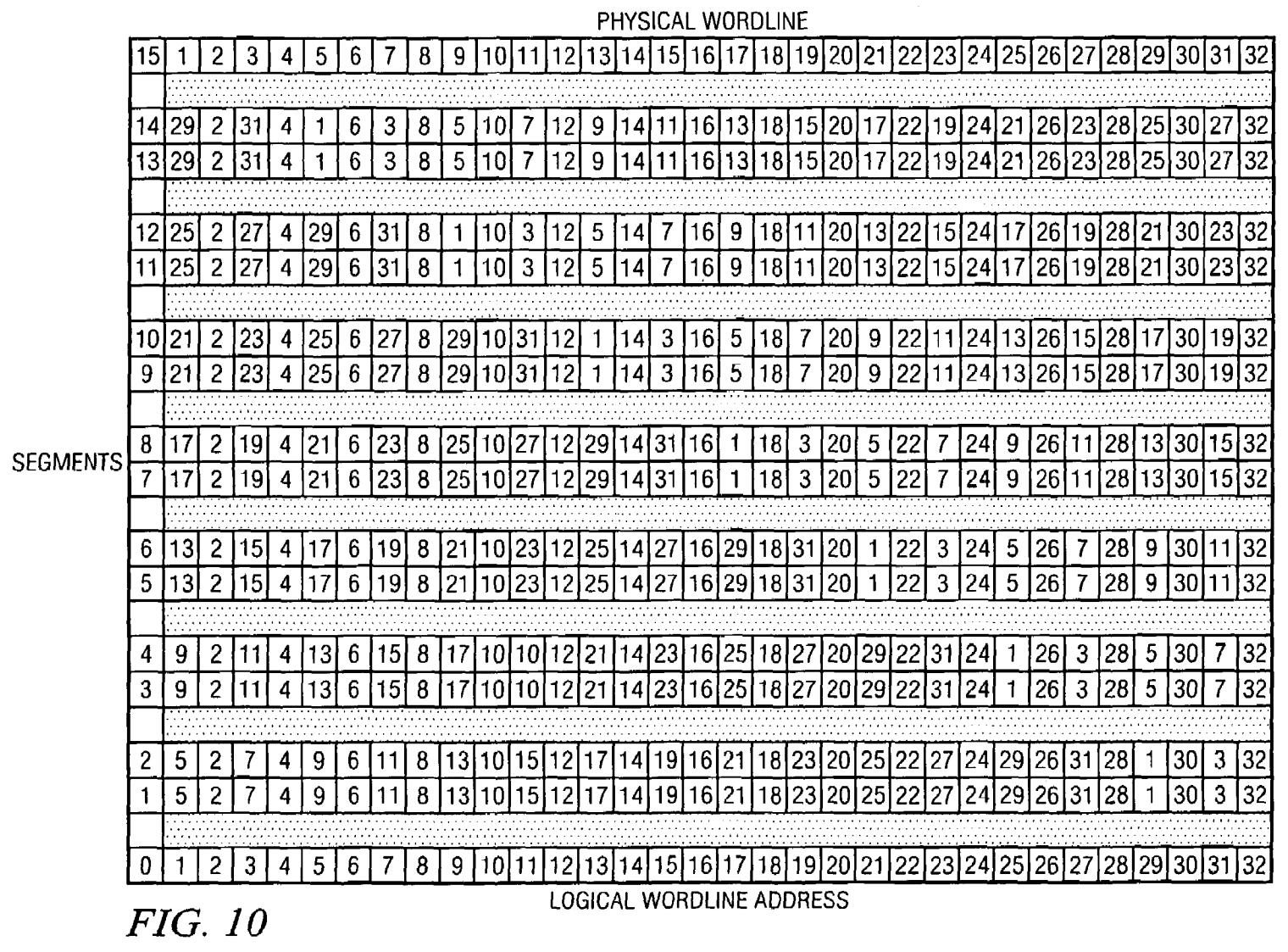

Referring to FIG. 10, there is a diagram showing an exemplary scrambling pattern for wordlines 1 through 32 of section 830 of FIG. 9. The bottom row of the diagram corresponds to the physical wordline position of each of the 32 wordlines corresponding to plateline 930 in segment 0. Segment numbers 0–15, corresponding to 16 segments 820–825 of FIG. 9, are in the left column of the diagram. Table entries of the diagram are logical addresses of each wordline at that physical location corresponding to a respective plateline group. Physical wordline positions and logical addresses are the same in the top and bottom rows. Shaded bands of the diagram correspond to segment drive circuits 920–925 (FIG. 9). Each even wordline is listed in a single respective column. Each odd wordline, however, changes columns so that no wordline is adjacent to any other wordline in a respective section for more than 2 segments.

Figure 11:
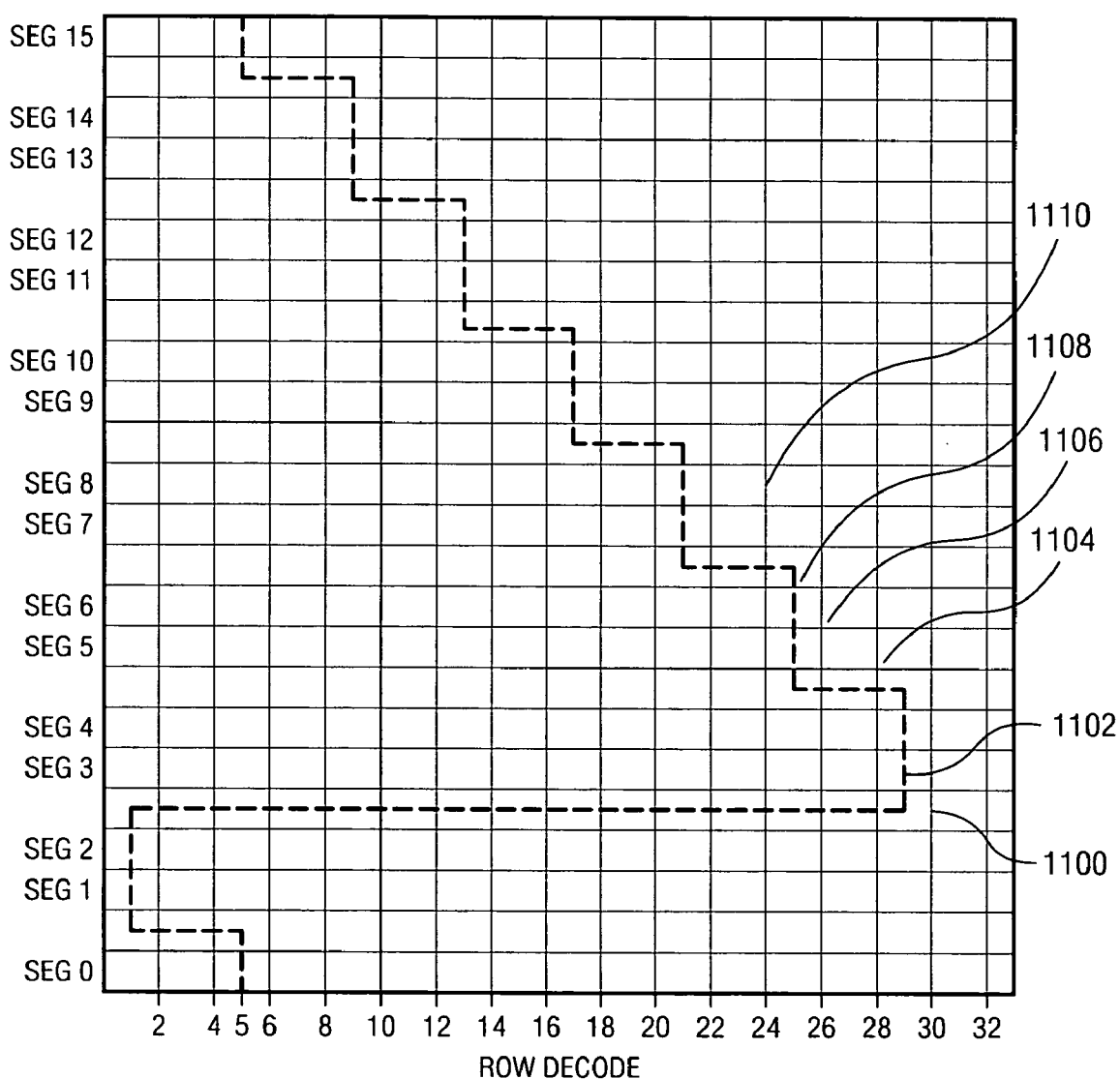
FIG. 11 is a diagram showing exemplary wordline 5 for the scrambling pattern of FIG. 10.

The diagram of FIG. 11 illustrates the routing of logical wordline 5 through section 830 (FIG. 9). All even wordlines are shown as bold vertical lines. Odd wordline 5 is shown as a dotted line. Vertical portions of wordline 5 include polycrystalline silicon segments connected to an overlying metal conductor. Horizontal portions of wordline 5 preferably include only the metal conductor. Wordline 5 is routed through segment 0 to the segment drive circuits between segment 0 and segment 1. The metal portion of wordline 5 is then routed horizontally through the segment drive circuits to physical wordline position 1. Next, wordline 5, including polycrystalline silicon and metal conductor, is routed vertically through segments 1 and 2. At the next segment drive circuit between segments 2 and 3, the metal portion of wordline 5 is routed horizontally to physical wordline position 29. At physical wordline position 29, wordline 5 is routed vertically through segments 3 and 4. The metal portion of wordline 5 is then routed horizontally to physical wordline position 25. At physical wordline position 25, wordline 5 is routed vertically through segments 5 and 6. This stair-step routing sequence of traversing 2 segments and 4 physical wordline positions continues to physical wordline position 5 where it is finally routed through segment 15 to terminate the sequence.

The exemplary embodiment of FIG. 11 of the present invention advantageously reduces fringe capacitance of wordline 5 to adjacent wordlines. Each wordline includes several parts corresponding to segments of the memory array. For example, when wordline 5 (1102) is routed through segments 3 and 4, fringe capacitance is primarily between immediately adjacent wordlines 28 (1104) and 30 (1100). When wordline 5 (1108) is routed through segments 5 and 6, fringe capacitance is primarily between immediately adjacent wordlines 24 (1110) and 26 (1106). Other odd wordlines follow the same stair-step routing pattern by subtracting 4 wordline positions prior to a vertical step. If subtracting 4 wordline positions would cross a plateline boundary, the next wordline position is calculated by adding 28 to the previous wordline position. Even wordlines, therefore, also share no more than 2 segments of fringe capacitance with immediately adjacent odd wordlines. Simulations have shown that array noise coupling to such immediately adjacent unselected wordlines is reduced from greater than 100 mV to less than 50 mV. Thus, array noise due to adjacent wordline coupling is greatly reduced to as little as one eighth of circuits of the prior art. Furthermore, resistance of the horizontal component of each odd wordline for 32 physical wordline positions is negligible. Thus, access time for memory cells on even and odd wordlines is substantially the same.

Figure 12:
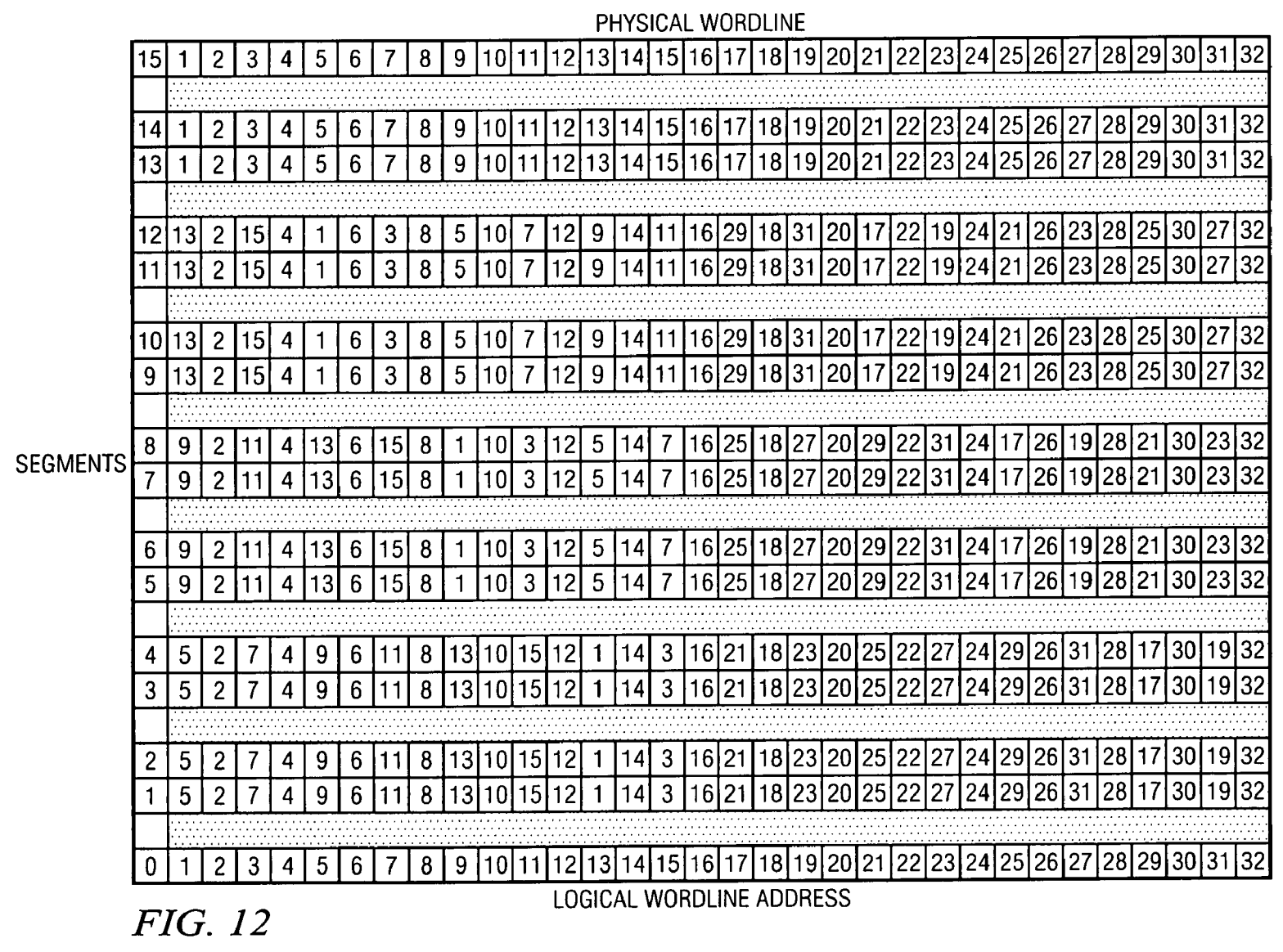
Figure 13:
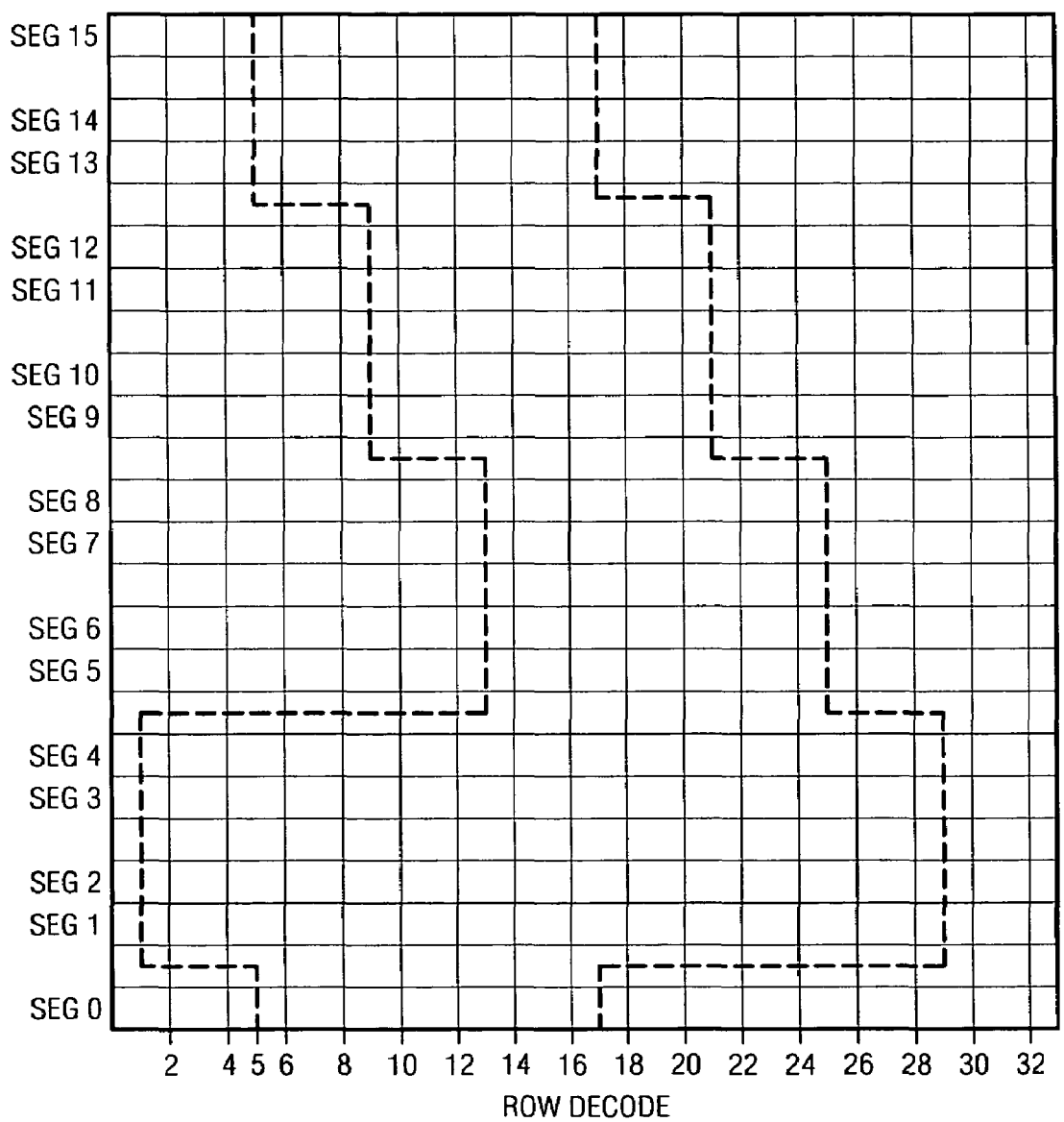
FIG. 13 is a diagram showing exemplary wordlines 5 and 17 for the scrambling pattern of FIG. 12.

Turning now to FIG. 12, there is a diagram of another embodiment of the present invention showing another exemplary scrambling pattern for 32 wordlines of section 830 (FIG. 9). All even wordlines are again shown as bold vertical lines. Physical positions of odd wordlines change in a stair-step pattern after traversing segments 0, 4, 8, and 12. Each selected wordline, therefore, shares a fringe capacitance component with 2 immediately adjacent even wordlines for no more than 4 segments. FIG. 13 illustrates this routing sequence for exemplary wordlines 5 and 17. Wordline 5 is routed through segment 0 to the segment drive circuits between segment 0 and segment 1. The metal portion of wordline 5 is then routed horizontally through the segment drive circuits to physical wordline position 1. Next, wordline 5, including polycrystalline silicon and metal conductor, is routed vertically through segments 1 through 4. At the next segment drive circuit between segments 4 and 5, the metal portion of wordline 5 is routed horizontally to physical wordline position 13. At physical wordline position 13, wordline 5 is routed vertically through segments 5 through 8. Wordline 5 is then routed horizontally to physical position 9 and vertically through segments 9 through 12. Finally, wordline 5 is routed horizontally to physical position 5 and vertically through segments 13 through 15 to terminate the sequence.

Wordline 17 is routed through segment 0 to the segment drive circuits between segment 0 and segment 1. The metal portion of wordline 17 is then routed horizontally through the segment drive circuits to physical wordline position 29. Next, wordline 17, including polycrystalline silicon and metal conductor, is routed vertically through segments 1 through 4. The metal portion of wordline 17 is then routed to physical wordline position 25 and vertically through segments 5 through 8. The stair-step routing pattern continues until wordline 17 returns to physical position 17 between segments 12 and 13. Wordline 17 is then routed vertically through segments 13 through 15 to terminate the sequence.

This embodiment of the present invention restricts each odd wordline to one half of a respective plateline. Horizontal routing of each odd wordline, therefore, is approximately one half of the distance of the embodiment of FIGS. 10 and 11. Odd wordlines follow the same stair-step routing pattern by subtracting 4 wordline positions prior to a vertical step. However, if subtracting 4 wordline positions would cross a plateline or half of the plateline boundary, the next wordline position is calculated by adding 12 to the previous wordline position. Each selected wordline advantageously shares fringe capacitance with immediately adjacent unselected wordlines for no more than 4 segments. Thus, array noise due to fringe capacitance may be as little as one fourth of circuits of the prior art.

Figure 14:
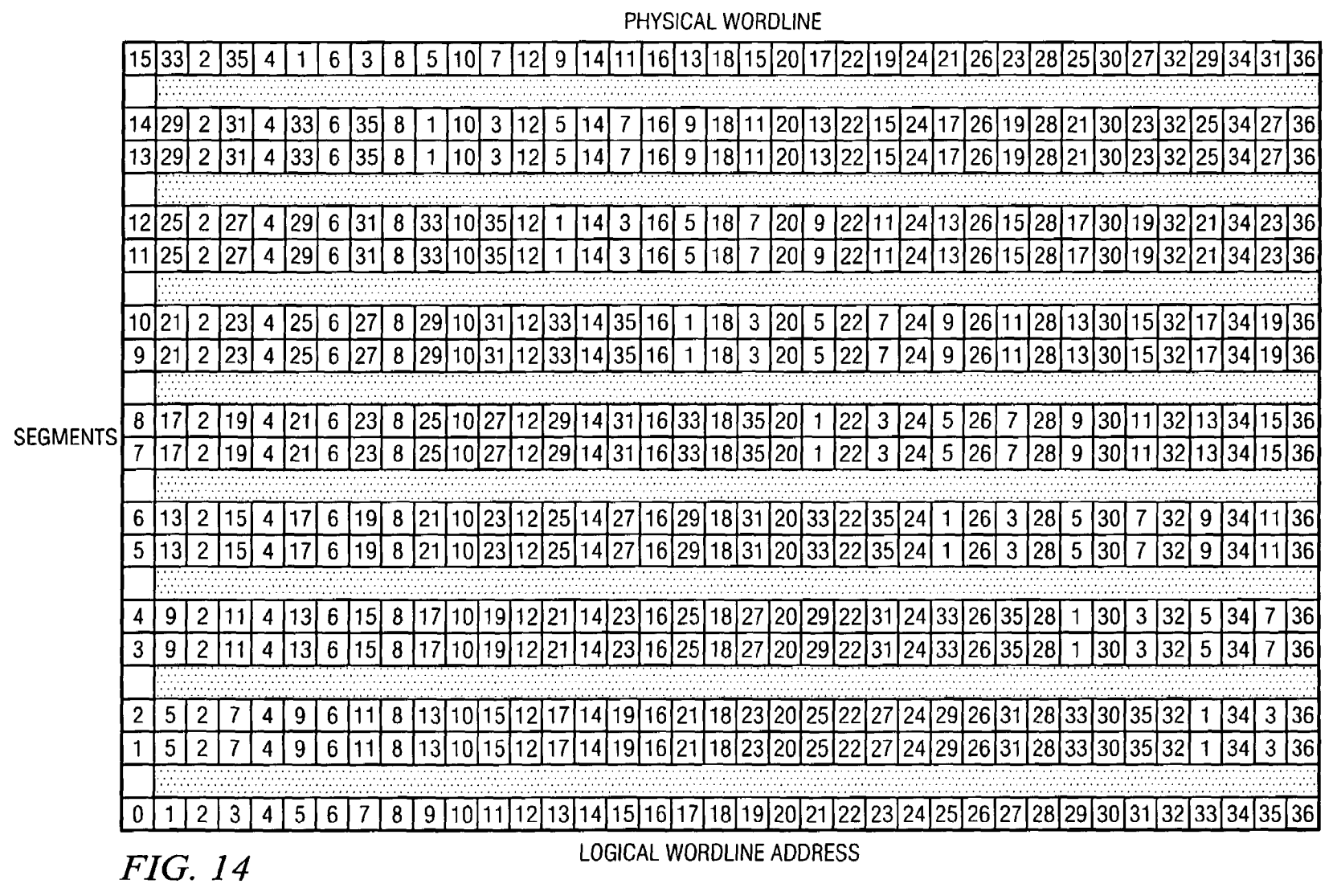
Figure 15:
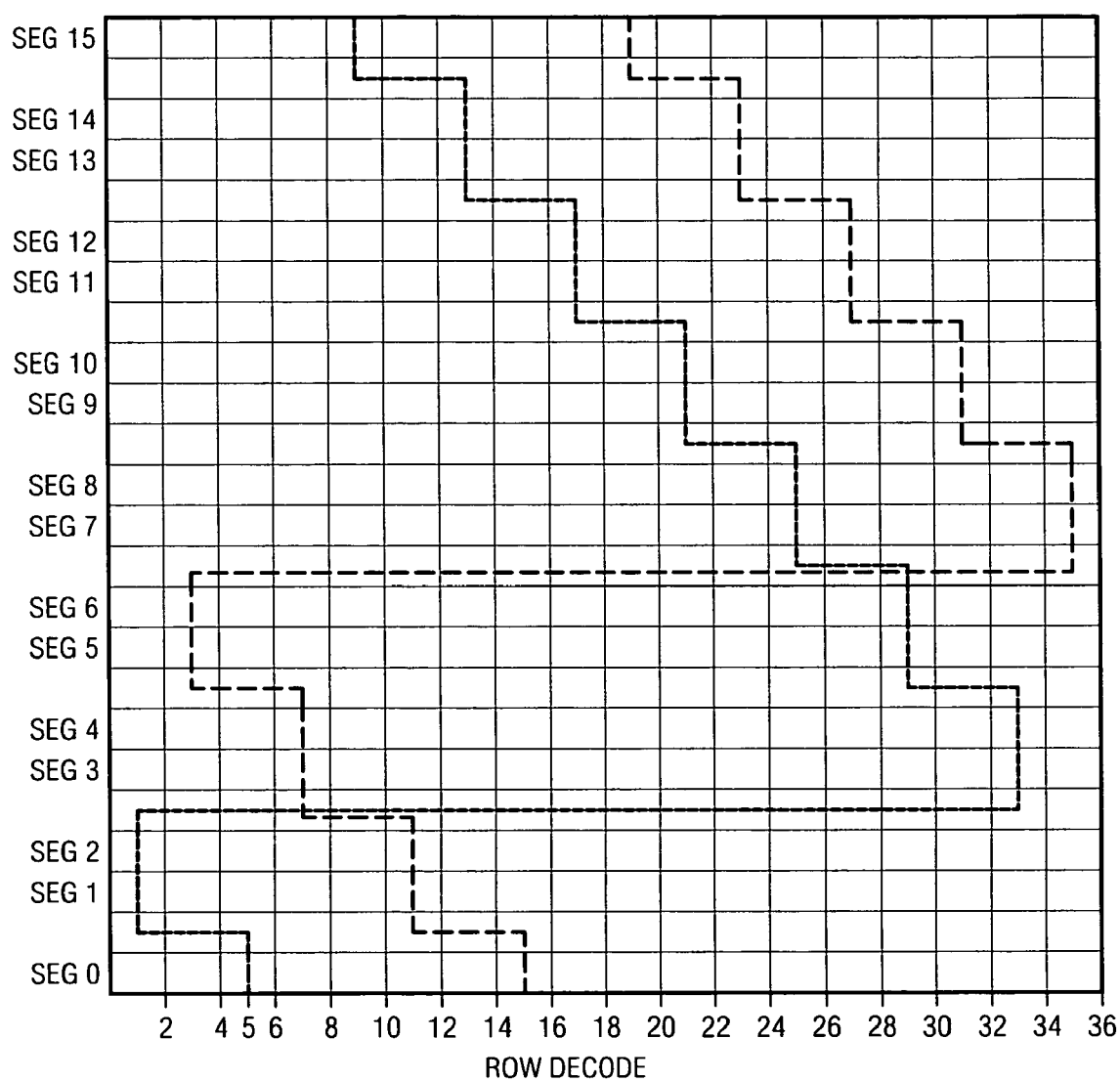
FIG. 15 is a diagram showing exemplary wordlines 5 and 15 for the scrambling pattern of FIG. 14.

Referring now to FIG. 14, there is a diagram showing an exemplary scrambling pattern for 32 wordlines with 4 redundant wordlines of section 830 of FIG. 9. Table entries of the diagram are logical addresses of each wordline at that physical location corresponding to a respective plateline group. Logical wordline addresses and physical wordline positions are the same in the bottom row. Plateline segment numbers are shown in the left column. The same stair-step routing pattern as previously described with respect to FIGS. 10 and 11 is used for the 36 normal and redundant wordlines. Each even wordline has the same physical position for all 16 segments. Each odd wordline begins at a respective physical position corresponding to its logical address. Each new position is calculated by subtracting 4 from the previous physical position. If subtracting 4 would cross a plateline boundary, the next physical position is calculated by adding 32 to the previous physical position. The diagram of FIG. 15 shows exemplary wordlines 5 and 15 for the scrambling pattern of FIG. 14. Wordlines 5 and 15 are shown in dotted and dashed pattern, respectively. Wordline 5 follows the same pattern as previously described with respect to FIG. 11 through segments 1 and 2 at wordline position 1. Subtracting 4 from wordline position 1, however, would produce a physical position outside the plateline boundary. The next physical wordline position, therefore, is 33 or the sum of 1 and 32. Wordline 5 is then routed vertically through segments 3 and 4. The previously described stair-step pattern of subtracting 4 wordline positions and traversing 2 segments then resumes. The routing pattern terminates when wordline 5 is routed through segment 15 at physical wordline position 9. The stair-step routing pattern of wordline 15 is similar to wordline 5 except that wordline 15 traverses segments 5 and 6 at physical wordline position 3. Subtracting 4 from position 3 would cross a plateline boundary. The next physical wordline position of 35 is calculated by adding 32 to the previous wordline position 3. Wordline 15 is then routed vertically through segments 7 and 8. The stair-step pattern of subtracting 4 wordline positions and traversing 2 segments then continues until wordline 15 traverses segment 15 at physical wordline position 19.

As with the embodiment of FIG. 11, of the present invention advantageously reduces fringe capacitance of wordline 5 to adjacent wordlines. No odd or even wordline in a segment is adjacent any other wordline for more than 2 segments. Thus, array noise due to adjacent wordline coupling is greatly reduced to as little as one eighth of circuits of the prior art. The embodiment of FIGS. 14 and 15, however, includes redundancy so that each wordline is not adjacent to every other wordline for 2 segments. For example, wordline 5 is only adjacent to even wordlines 4 and 6 for one segment. Likewise, wordline 15 is only adjacent to even wordlines 14 and 16 for a single segment. Array noise due to adjacent wordline coupling, therefore, is advantageously distributed over the entire segment, thereby significantly reducing voltage coupled from any active wordline to any other adjacent and unselected wordline. Subthreshold leakage depends exponentially on gate voltage. Thus, charge loss at storage nodes of unselected memory cells is greatly reduced when gate voltage coupled to unselected wordlines is reduced. A reduction of maximum gate voltage from 100 mV to 50 mV for an unselected memory cell, for example, corresponds to a reduction of subthreshold current by a factor of 3. Furthermore, resistance of the horizontal component of each odd wordline for 36 physical wordline positions is negligible. Thus, access time for memory cells on even and odd wordlines is substantially the same.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, a preferred embodiment of the present invention has been described with respect to a one-transistor/one-capacitor (1T/1C) ferroelectric memory cell. The present invention is equally applicable to a one-transistor/one-capacitor (1T/1C) dynamic random access memory cell, a static random access memory (SRAM) cell, or other memory cell as known in the art. Moreover, the present invention is equally applicable to two-transistor/two-capacitor (2T/2C) ferroelectric or dynamic random access memory cells. These 2T/2C cells are complementary 1T/1C memory cells. A wordline (or wordlines) activates the 2T/2C memory cell, thereby coupling the complementary 1T/1C memory cells to their respective complementary bitlines. If the 2T/2C memory cell stores a data "1", for example, the true and complementary bitline voltages change to produce a total difference voltage. The present invention has been described with reference to an architecture wherein several wordlines are common to a plateline. However, the invention is equally applicable to an architecture wherein a plateline is not shared by more than one wordline. It is therefore intended that the appended claims encompass any such modifications or embodiments.

What is claimed is:

1. A memory circuit, comprising:
    a plurality of memory cells arranged in rows and columns, each row having a first part and a second part;
    a first conductor coupled to a respective column of memory cells in each first part;
    a second conductor coupled to a respective column in each second part; and
    a third conductor coupled to a control terminal of each memory cell in the first part of a first row and the second part of a second row.

2. A memory circuit as in claim 1, wherein the first and second conductors are bitlines and wherein the third conductor is a wordline.

3. A memory circuit as in claim 2, wherein the wordline comprises polycrystalline silicon.

4. A memory circuit as in claim 2, comprising a plurality of platelines coupled to the plurality of memory cells.

5. A memory circuit as in claim 2, comprising:
    a first pair of wordlines coupled to said respective column of memory cells in each first part, wherein the first part of the first row is between and adjacent to the first pair of wordlines; and
    a second pair of wordlines different from the first pair of wordlines and coupled to said respective column of memory cells in each second part, wherein the second part of the second row is between and adjacent to the second pair of wordlines.

6. A memory circuit as in claim 5, wherein the third conductor is a redundant wordline and wherein at least one of the first pair of wordlines is a normal wordline.

7. A memory circuit as in claim 1, wherein each said memory cell comprises Lead Zirconate Titanate (PZT).

8. A memory circuit as in claim 1, wherein each said memory cell comprises Strontium Bismuth Titanate (SBT).

9. A memory circuit as in claim 2, wherein each said memory cell is a dynamic random access memory cell.

10. A memory circuit, comprising:
    a plurality of memory cells arranged in rows and columns, each row having a first part and a second part;
    a first conductor coupled to a respective column of memory cells in each first part;
    a second conductor coupled to a respective column in each second part; and
    a third conductor overlying the first part of a first row and the second part of a second row.

11. A memory circuit as in claim 10, wherein the first and second conductors are bitlines and wherein the third conductor comprises a wordline shunt.

12. A memory circuit as in claim 11, comprising a wordline electrically connected to the wordline shunt.

13. A memory circuit as in claim 12, wherein the wordline is coupled to a control terminal of each memory cell in the first part of a first row and the second part of a second row.

14. A memory circuit as in claim 12, wherein the wordline is coupled to a control terminal of each memory cell in the first part of a first row and the second part of a first row.

15. A memory circuit as in claim 10, wherein each said memory cell comprises Lead Zirconate Titanate (PZT).

16. A memory circuit as in claim 10, wherein each said memory cell comprises Strontium Bismuth Titanate (SBT).

17. A memory circuit as in claim 11, wherein each said memory cell is a dynamic random access memory cell.

18. A portable electronic device, comprising:
    a processor circuit; and
    a memory circuit coupled to the processor circuit, the memory circuit comprising:
        a plurality of memory cells arranged in rows and columns, each row having a first part and a second part;
        a first bitline coupled to a respective column of memory cells in each first part;
        a second bitline coupled to a respective column of memory cells in each second part; and
        a wordline coupled to a control terminal of each memory cell in the first part of a first row and the second part of a second row.

19. A portable electronic device as in claim 18, wherein the memory circuit is a nonvolatile memory circuit.

20. A portable electronic device as in claim 18, wherein the memory circuit is a dynamic random access memory circuit.

21. A portable electronic device as in claim 18, wherein the memory circuit comprises a plurality of platelines coupled to the plurality of memory cells.

22. A portable electronic device as in claim 18, wherein the memory circuit comprises:
    a first pair of wordlines coupled to said respective column of memory cells in each first part, wherein the first part of the first row is between and adjacent to the first pair of wordlines; and
    a second pair of wordlines different from the first pair of wordlines and coupled to said respective column of memory cells in each second part, wherein the second part of the second row is between and adjacent to the second pair of wordlines.

23. A portable electronic device as in claim 18, comprising:
    a keypad coupled to the processor circuit; and
    a display coupled to the processor circuit.

* * * * *